United States Patent
Arai et al.

(10) Patent No.: US 9,917,183 B2
(45) Date of Patent: Mar. 13, 2018

(54) SEMICONDUCTOR DEVICE

(71) Applicant: KABUSHIKI KAISHA TOSHIBA, Tokyo (JP)

(72) Inventors: Masatoshi Arai, Hakusan Ishikawa (JP); Yoshitaka Hokomoto, Kanazawa Ishikawa (JP); Tatsuya Nishiwaki, Komatsu Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/819,068

(22) Filed: Aug. 5, 2015

(65) Prior Publication Data
US 2016/0268420 A1    Sep. 15, 2016

(30) Foreign Application Priority Data
Mar. 9, 2015   (JP) .................. 2015-046471

(51) Int. Cl.
*H01L 29/76* (2006.01)
*H01L 29/94* (2006.01)
(Continued)

(52) U.S. Cl.
CPC ........ *H01L 29/7813* (2013.01); *H01L 29/407* (2013.01); *H01L 29/66734* (2013.01); *H01L 29/41766* (2013.01)

(58) Field of Classification Search
CPC . H01L 29/7813; H01L 29/407; H01L 29/402; H01L 29/66734; H01L 29/41766
(Continued)

(56) References Cited

U.S. PATENT DOCUMENTS 7,554,153 B2 * 6/2009 Henson ............... H01L 29/1095
257/330
2012/0061723 A1   3/2012 Ishii
(Continued)

FOREIGN PATENT DOCUMENTS

JP      2008-227514 A    9/2008
JP       2012064641 A    3/2012
(Continued)

OTHER PUBLICATIONS

Japanese Office Action dated Sep. 11, 2017, filed in Japanese counterpart Application No. 2015-046471, 17 pages (with translation).

*Primary Examiner* — Thien F Tran
(74) *Attorney, Agent, or Firm* — Patterson & Sheridan, LLP

(57) ABSTRACT

A semiconductor device is provided including a first electrode and a first semiconductor layer of a first conductivity type connected to the first electrode. The semiconductor device further includes a second semiconductor layer of a second conductivity type provided on the first semiconductor layer, a third semiconductor layer of the first conductivity type provided on the second semiconductor layer, and a second electrode provided on the third semiconductor layer. The semiconductor device further includes a third electrode disposed between the first electrode and the second electrode. The semiconductor device further includes a fourth electrode having an upper end connected to the second electrode, where the fourth electrode has a higher resistivity than the second electrode.

15 Claims, 8 Drawing Sheets

(51) Int. Cl.
*H01L 31/062* (2012.01)
*H01L 31/113* (2006.01)
*H01L 31/119* (2006.01)
*H01L 29/78* (2006.01)
*H01L 29/40* (2006.01)
*H01L 29/66* (2006.01)
*H01L 29/417* (2006.01)

(58) Field of Classification Search
USPC .............................. 257/330, 329, 328, 331
See application file for complete search history.

(56) References Cited

U.S. PATENT DOCUMENTS

| | | | |
|---|---|---|---|
| 2012/0241854 A1* | 9/2012 | Ohta | H01L 29/0856 257/331 |
| 2013/0062688 A1 | 3/2013 | Kobayashi | |
| 2013/0134505 A1 | 5/2013 | Kobayashi | |
| 2013/0168760 A1 | 7/2013 | Hsieh | |
| 2013/0181723 A1* | 7/2013 | Mauder | G01R 19/0092 324/601 |
| 2014/0077278 A1 | 3/2014 | Nozu | |
| 2014/0179094 A1 | 6/2014 | Kobayashi et al. | |

FOREIGN PATENT DOCUMENTS

| | | | |
|---|---|---|---|
| JP | 2012164916 A | 8/2012 |
| JP | 2012204395 A | 10/2012 |
| JP | 2013062344 A | 4/2013 |
| JP | 2014060298 A | 4/2014 |

* cited by examiner

SEMICONDUCTOR DEVICE

CROSS-REFERENCE TO RELATED APPLICATION

This application is based upon and claims the benefit of priority from Japanese Patent Application No. 2015-046471, filed Mar. 9, 2015, the entire contents of which are incorporated herein by reference.

FIELD

Embodiments described herein relate generally to a semiconductor device.

BACKGROUND

In general, as a semiconductor device for power control, a vertical Metal-Oxide-Semiconductor Field-Effect Transistor (MOSFET) can be used. Modifications to a design of a vertical MOSFET can be effective in achieving both a low on-resistance and a high switching speed, but ensuring reliability becomes a problem when making such design modifications.

DETAILED DESCRIPTION

Embodiments provide a semiconductor device in which a reduction in a breakdown voltage can be suppressed.

In general, according to one embodiment, a semiconductor device includes a first electrode, a first semiconductor layer of a first conductivity type electrically connected to the first electrode, a second semiconductor layer of a second conductivity type on the first semiconductor layer, a third semiconductor layer of the first conductivity type on the second semiconductor layer, a second electrode on the third semiconductor layer and electrically connected to the third semiconductor layer, a third electrode adjacent, in a first direction, to the second semiconductor layer and between the first electrode and the second electrode in a second direction that crosses the first direction, and a fourth electrode having a first end connected to the second electrode. The fourth electrode is separated from the first semiconductor layer, the second semiconductor layer, the third semiconductor layer, and the third electrode by an insulation film, and an electrical resistivity of the fourth electrode is greater than an electrical resistivity of the second electrode.

First Embodiment

Figure 1:
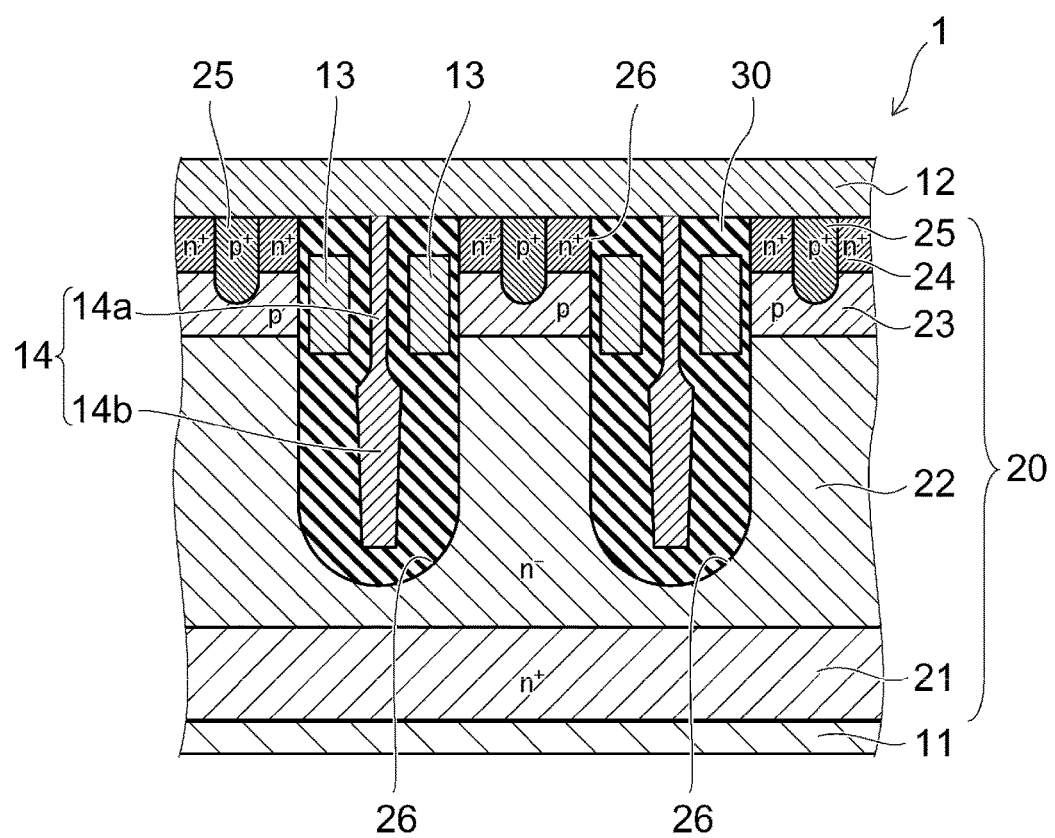
FIG. 1 is a cross-sectional view which shows a semiconductor device according to a first embodiment.

FIG. 1 is a cross-sectional view which shows a semiconductor device 1 according to the first embodiment.

As shown in FIG. 1, the semiconductor device 1 according to the first embodiment is, for example, a vertical MOSFET for power control. The semiconductor device 1 includes a drain electrode 11 made of, for example, metal. An $n^+$-type drain layer 21 of which the conductivity type is an $n^+$-type is provided on the drain electrode 11. A lower surface of the $n^+$-type drain layer 21 is in contact with an upper surface of the drain electrode 11. An $n^-$-type drift layer 22 of which the conductivity type is an $n^-$-type is provided on the $n^+$-type drain layer 21.

Hereinafter, for convenience of description, a direction from the drain electrode 11 to the $n^+$-type drain layer 21 is referred to as "up" or an "upward direction," and an opposite direction is referred to as "down" or a "depth direction". However, these directions are independent from a direction of gravity and are used for simplicity of explanation. In addition, in this specification, superscripts "+" and "−" subjected to characters "p" and "n" which show a conductivity type show a relative carrier concentration. For example, a region of which the conductivity type is an n-type is written as "$n^+$-type", "n-type", or "$n^-$-type" in an order of the carrier concentration. The same notation is applied to a p-type. A carrier concentration is regarded as an effective impurity concentration. The "effective impurity concentration" refers to a concentration of impurities that contribute to conductivity of a semiconductor material, and when any portion, region, or layer contains both an impurity serving as a donor and an impurity serving as an acceptor, the "effective impurity concentration" refers to a concentration after the impurities offset each other (a net concentration).

A p-type base layer 23 is provided on the $n^-$-type drift layer 22. An $n^+$-type source layer 24 is provided on the p-type base layer 23. In addition, a $p^+$-type contact layer 25 adjacent to the $n^+$-type source layer 24 is provided in the p-type base layer 23. A bottom of the $p^+$-type contact layer 25 extends into the p-type base layer 23, but the bottom of the $p^+$-type contact layer 25 does not reach a lower surface of the p-type base layer 23. An upper portion of the $p^+$-type contact layer 25 is adjacent to an upper portion of the $n^+$-type source layer 24. An upper surface of the $p^+$-type contact layer 25 is exposed with an upper surface of the $n^+$-type source layer 24 before a source electrode 12 is provided on the upper surfaces of the $n^+$-type source layer 24 and the $p^+$-type contact layer 25.

A semiconductor portion 20 includes the $n^+$-type drain layer 21, the $n^-$-type drift layer 22, the p-type base layer 23, the $n^+$-type source layer 24, and the $p^+$-type contact layer 25. The semiconductor portion 20 is made of, for example, single-crystal silicon (Si). As described in further detail below, for example, the $n^+$-type drain layer 21 can be a part of a silicon wafer, and the other parts of the semiconductor portion 20 can be epitaxial silicon layers grown on the silicon wafer.

The source electrode 12 made of, for example, metal, is provided on the semiconductor portion 20. A lower surface of the source electrode 12 is flat, and is in contact with an upper surface of the $n^+$-type source layer 24 and an upper surface of the $p^+$-type contact layer 25. Accordingly, the lower surface of the source electrode 12 is connected to the n$^+$-type source layer 24 and the p$^+$-type contact layer 25.

The semiconductor device 1 includes a plurality of trenches 26 separated from each other along the horizontal (left-right page) direction of FIG. 1 (hereinafter, referred to as the "first direction"). The plurality of trenches 26 are also formed to extend in a direction from an upper surface side of the semiconductor portion 20 towards the drain electrode 11 (hereinafter, referred to as the "thickness direction" or a "second direction"). The trenches 26 also extend in a direction parallel to an upper surface of the drain electrode 11 perpendicular to the page plane of FIG. 1, that is in to (and out of) the page plane of FIG. 1 (hereinafter, referred to as the "third direction"). Each of the trenches 26 extends from the source electrode 12 in the thickness direction towards a bottom of the n$^-$-type drift layer 22 through the n$^+$-type source layer 24, the p-type base layer 23, and a portion of the n$^-$-type drift layer 22. However, the trenches 26 do not extend through all of the n$^-$-type drift layer 22 along the thickness direction. Each p$^+$-type contact layer 25 also extends in the second direction. In the first direction, the p$^+$-type contact layers 25 and the trenches 26 are alternately arranged and are spaced from each other.

An insulation film 30 which is made of, for example, silicon oxide is embedded in the trench 26. An upper surface of the insulation film 30 is in contact with a lower surface of the source electrode 12. A pair of gate electrodes 13 is provided in each trench 26. Each gate electrode 13 is embedded in the insulation film 30 of trench 26. Each gate electrode 13 is positioned in a trench 26 at a depth such as to face an upper portion of an n$^-$-type drift layer 22, all of a p-type base layer 23, and a bottom portion of an n$^+$-type source layer 24 through the insulation film 30. Each third electrode has a portion located at a same depth along the thickness direction from the source electrode 12 as a portion of the p-type base layer 23. A bottom surface of each n$^+$-type source layer 24 is positioned at a depth (distance) along the thickness direction deeper from the source electrode 12 than a depth (distance) of an upper surface of each gate electrode 13 from the source electrode 12. A bottom surface of each gate electrode 13 is positioned at a depth along the thickness deeper than a depth of the bottom surface of each p-type base layer 23. Thus, the gate electrode 13 extends past all of the p-type base layer 23 in the thickness direction. The pair of gate electrodes 13 is arranged, so that one gate electrode 13 is positioned at either side of a given trench 26 in the first direction, and each gate electrode 13 extends in the thickness direction. Accordingly, each gate electrode 13 faces the p-type base layer through the insulation film 30. Moreover, the gate electrode 13 is formed from, for example, poly-silicon. Each gate electrode 13 is insulated from the semiconductor portion 20, the drain electrode 11, and the source electrode 12 by the insulation film 30.

A field plate (FP) electrode 14 is provided at a middle of each trench 26 along the first direction. The FP electrode 14 is formed from, for example, poly-silicon. Accordingly, a resistivity of the source electrode 12, which is made of metal, is lower than a resistivity of the FP electrode 14. The FP electrode 14 extends in the third direction. An upper portion 14a of each FP electrode 14 is positioned between the pair of gate electrodes 13 for the trench 26 in which the FP electrode 14 is located. A bottom portion 14b of each FP electrode is positioned at a depth below the pair of gate electrodes 13 for each trench 26. The bottom portion 14b of the FP electrode 14 is wider than the upper portion 14a in the first direction, and a width of the bottom portion 14b in the first direction takes a maximum value at a depth somewhat spaced away from a boundary between the bottom portion 14b and the upper portion 14a. The bottom portion 14b becomes narrower as the bottom portion 14b extends downward in the thickness direction and away from the upper portion 14a. An upper end of the FP electrode 14 is positioned at a depth above an upper end of the gate electrode 13, and is in contact with a lower surface of the source electrode 12. Accordingly, the upper end of the FP electrode 14 is connected to a lower surface of the source electrode 12. On the other hand, a lower end of the FP electrode 14 is positioned at a depth that does not reach a lower end of the trench 26, and the lower end of the FP electrode 14 is covered with the insulation film 30.

Next, a method of manufacturing the semiconductor device according to the first embodiment will be described.

FIGS. 2A and 2B, FIGS. 3A and 3B, and FIGS. 4A and 4B are cross-sectional views which show a method of manufacturing the semiconductor device according to the embodiment.

Figure 2A:
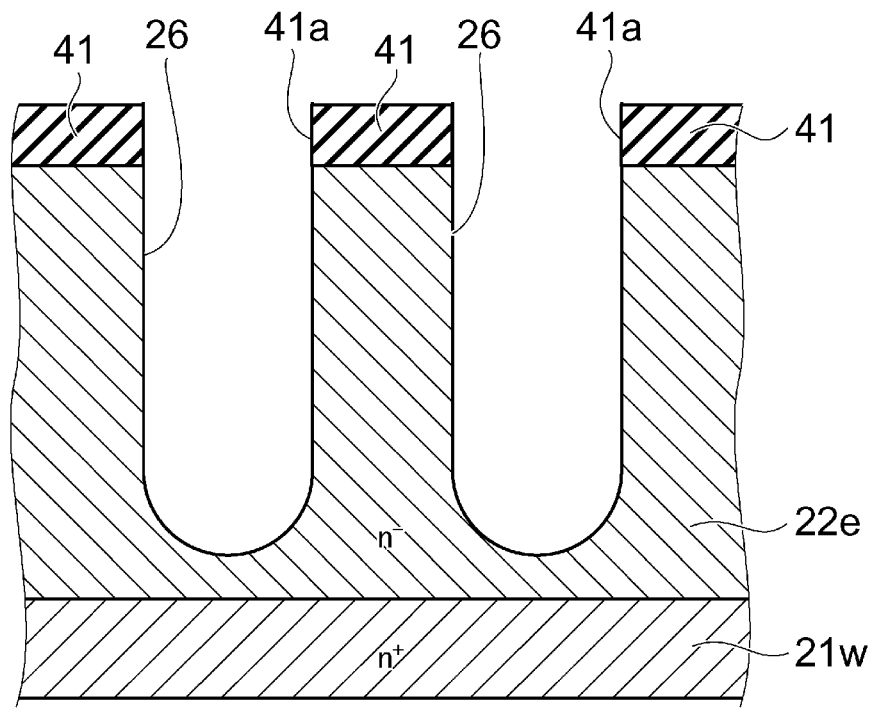
FIGS. 2A and 2B are cross-sectional views which show a method of manufacturing a semiconductor device according to the first embodiment.

First, as shown in FIG. 2A, an n$^-$-type silicon layer is epitaxially grown on an n$^+$-type silicon wafer 21w to form an n$^-$-type epitaxial layer 22e. Then, a mask 41 is formed on the n$^-$-type epitaxial layer 22e. An opening 41a having a width in the first direction and extending in the second direction is formed in the mask 41 by lithography. Then, a plurality of trenches 26 are formed in the n$^-$-type epitaxial layer 22e by performing anisotropic etching such as Reactive Ion Etching (RIE) using the mask 41 as an etch mask. The trench 26 does not pass through the entire thickness of the n$^-$-type epitaxial layer 22e. Then, the mask 41 is removed.

Figure 2B:
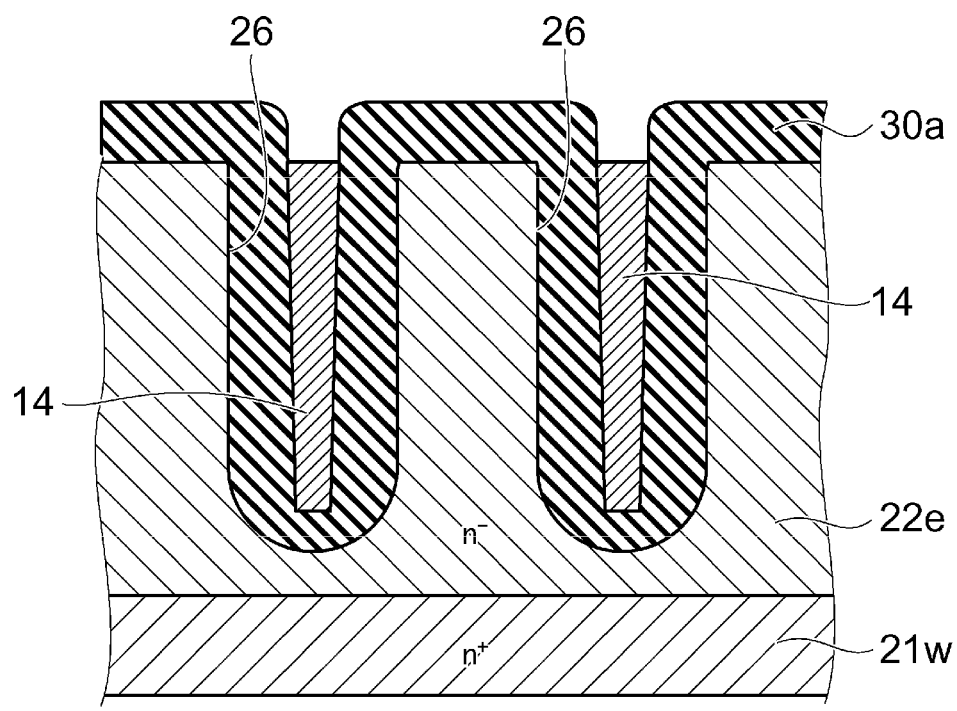

As shown in FIG. 2B, for example, an insulating film, such as silicon oxide, is deposited on a surface of the n$^-$-type epitaxial layer 22e to form an insulation film 30a. The insulation film 30a is formed on an inner surface of the trench 26, but the trench 26 is not completely filled with the insulation film 30a. Next, for example, silicon is deposited to form the FP electrode 14 made of poly-silicon on a surface of the insulation film 30a in the trench 26 by etching back.

Figure 3A:
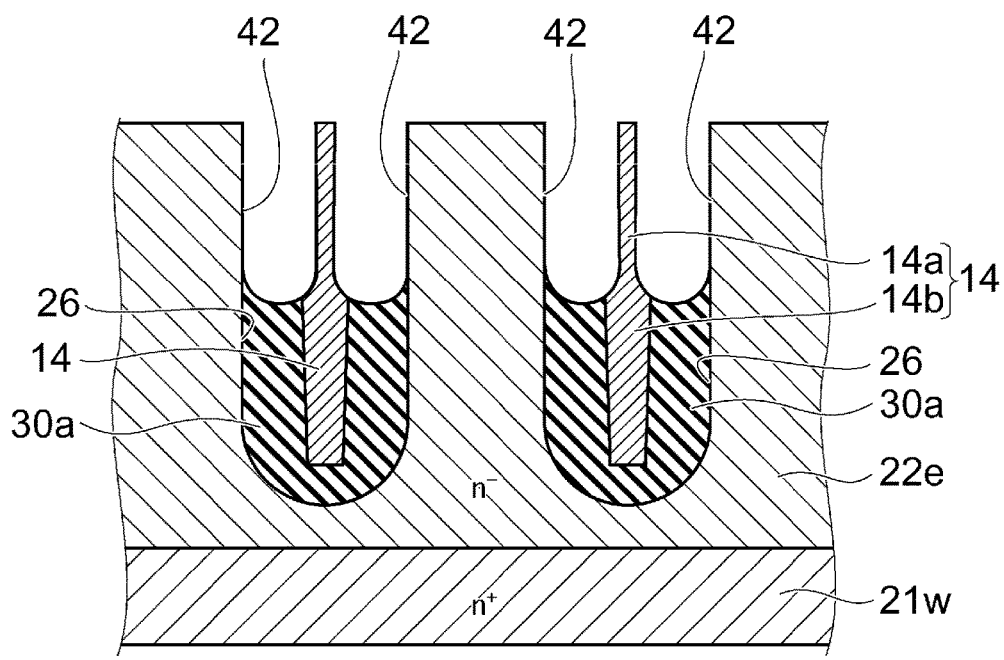
FIGS. 3A and 3B are cross-sectional views which show the method of manufacturing a semiconductor device according to the first embodiment.

Next, as shown in FIG. 3A, a portion of the insulation film 30a arranged on an upper surface of the n$^-$-type epitaxial layer 22e and a portion of the insulation film 30a arranged in an upper portion of the trench 26 are removed by etching back under a condition of preferentially etching the silicon oxide relative to silicon. Due to the preferential etching, the bottom portion 14b of the FP electrode 14 remains embedded in the insulation film 30a. Accordingly, a pair of grooves 42 extending is formed at both sides of the upper portion of the trench 26 in the first direction.

Figure 3B:
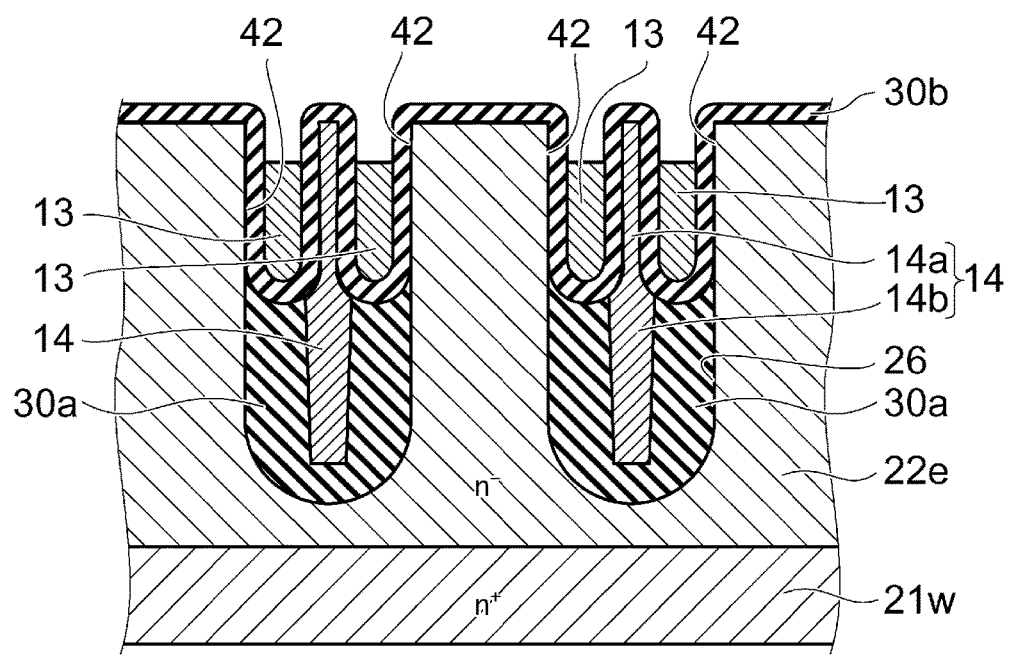

Next, as shown in FIG. 3B, for example, silicon oxide is deposited on an entire upper surface to form the insulation film 30b. The insulation film 30b is formed on an inner surface of the groove 42, but the groove 42 is not completely filled with the insulation film 30b. Accordingly, the upper portion 14a of the FP electrode 14 is covered with the insulation film 30b. At this time, since the FP electrode 14 is formed from poly-silicon of which impurity is doped in a high concentration, the upper portion 14a is promoted to be oxidized and to be narrowed to a certain extent. Then, the gate electrode 13 made of poly-silicon is formed on a surface of the insulation film 30b in each of the grooves 42 by depositing and then etching back, for example, preferentially allowing the silicon to remain. At this time, an upper end of the gate electrode 13 is set to be a position lower than an upper end of the FP electrode 14.

Figure 4A:
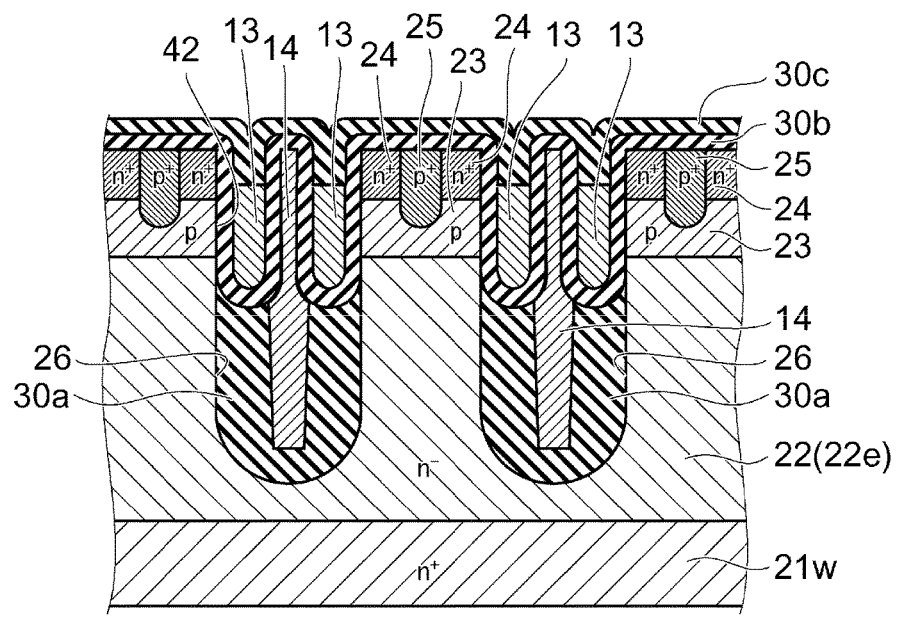
FIGS. 4A and 4B are cross-sectional views which show the method of manufacturing a semiconductor device according to the first embodiment.

Next, as shown in FIG. 4A, the p-type base layer 23 is formed on an upper portion of the n$^-$-type epitaxial layer 22e by ion-implanting an impurity serving as an acceptor. Then, the $n^+$-type source layer 24 is formed on an upper portion of the p-type base layer 23 by ion-implanting an impurity serving as a donor. Then, a mask (not shown) is formed on the $n^+$-type source layer 24, and a portion of an upper portion of the p-type base layer 23 and a portion of the $n^+$-type source layer 24 becomes the $p^+$-type contact layer 25 by ion-implanting an impurity serving as an acceptor. A portion of the $n^-$-type epitaxial layer 22e which is not the p-type base layer 23, the $n^+$-type source layer 24, and the $p^+$-type contact layer 25 becomes the $n^-$-type drift layer 22. The semiconductor portion 20 is formed by an $n^+$-type silicon wafer 21w, the $n^-$-type drift layer 22, the p-type base layer 23, the $n^+$-type source layer 24, and the $p^+$-type contact layer 25. Then, for example, a silicon oxide is deposited on an entire surface to form an insulation film 30c. The insulation film 30c also enters into the groove 42 to cover an upper surface of the gate electrodes 13.

Figure 4B:
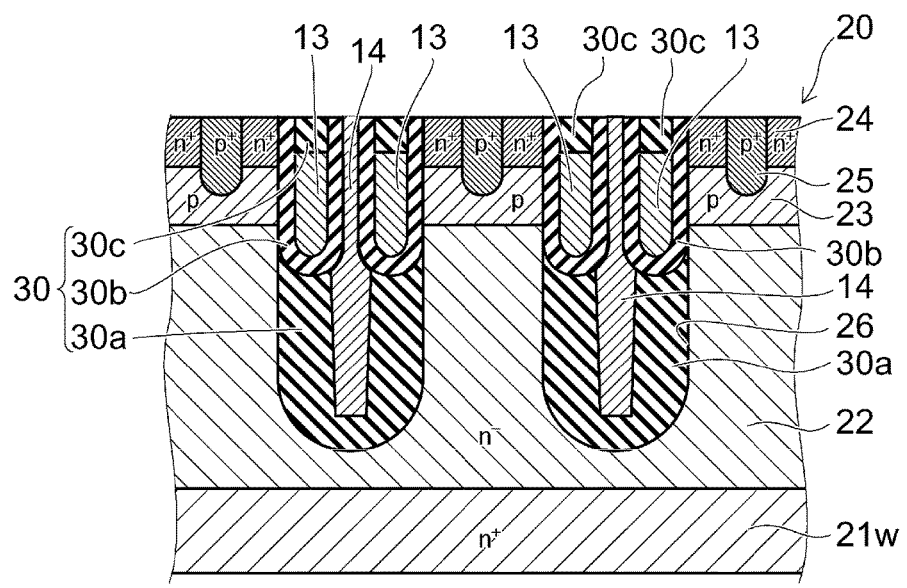

As shown in FIG. 4B, the upper surfaces of the semiconductor portion 20 and the FP electrode 14 are exposed by etching back the insulation films 30c and 30b. The gate electrodes 13 remain covered with the insulation film 30c, and is not exposed.

As shown in FIG. 1, the source electrode 12 is formed on upper surfaces of the semiconductor portion 20, the FP electrode 14, and the insulation film 30c by depositing a metal on an entire surface. The source electrode 12 is in contact with the $n^+$-type source layer 24, the $p^+$-type contact layer 25, and the FP electrode 14. In addition, the drain electrode 11 is formed on a lower surface of the semiconductor portion 20. The drain electrode 11 is in contact with the $n^+$-type silicon wafer 21w. Next, the $n^+$-type silicon wafer 21w is diced. Accordingly, a number of semiconductor devices 1 are singulated from one $n^+$-type silicon wafer 21w and a stacked body formed on an upper surface and a lower surface of the $n^+$-type silicon wafer 21w. At this time, the $n^+$-type silicon wafer 21w becomes the $n^+$-type drain layer 21. In addition, the insulation film 30 is formed by the insulation films 30a, 30b, and 30c. In this manner, the semiconductor device 1 according to the embodiment is manufactured.

An effect of the embodiment is described next.

In the semiconductor device 1 according to the first embodiment, when a potential (FP potential) of the FP electrode 14 can match a potential (source potential) of the source electrode 12, a shape, a size, and the like of each portion of the semiconductor portion 20 can be designed, so that the semiconductor device 1 obtains a predetermined breakdown voltage. On the other hand, if the FP potential can fluctuate significantly from the source potential, then the breakdown voltage of the semiconductor device 1 would be lowered. An upper surface of the FP electrode 14 made of poly-silicon is connected to a lower surface of the source electrode 12 made of metal in the semiconductor device 1. Accordingly, a maximum distance from the source electrode 12 to the each portion of the FP electrode 14 is shortened. This connection between the FP electrode 14 and the source electrode 12 makes it possible to stably fix the FP potential to the source potential. Accordingly, even when switching the semiconductor device 1, the FP potential hardly changes, and thus the breakdown voltage is hardly lowered due to a change of the FP potential. Furthermore, the stable FP potential makes it less likely that an avalanche breakdown caused by a lowering of the breakdown voltage will occur, and there is also less likelihood of an unintended current between the source electrode 12 and the drain electrode 11.

As a result, the design of the semiconductor device 1 makes it possible to achieve a highly reliable semiconductor device.

Comparative Example

Next, a comparative example will be described.

Figure 5:
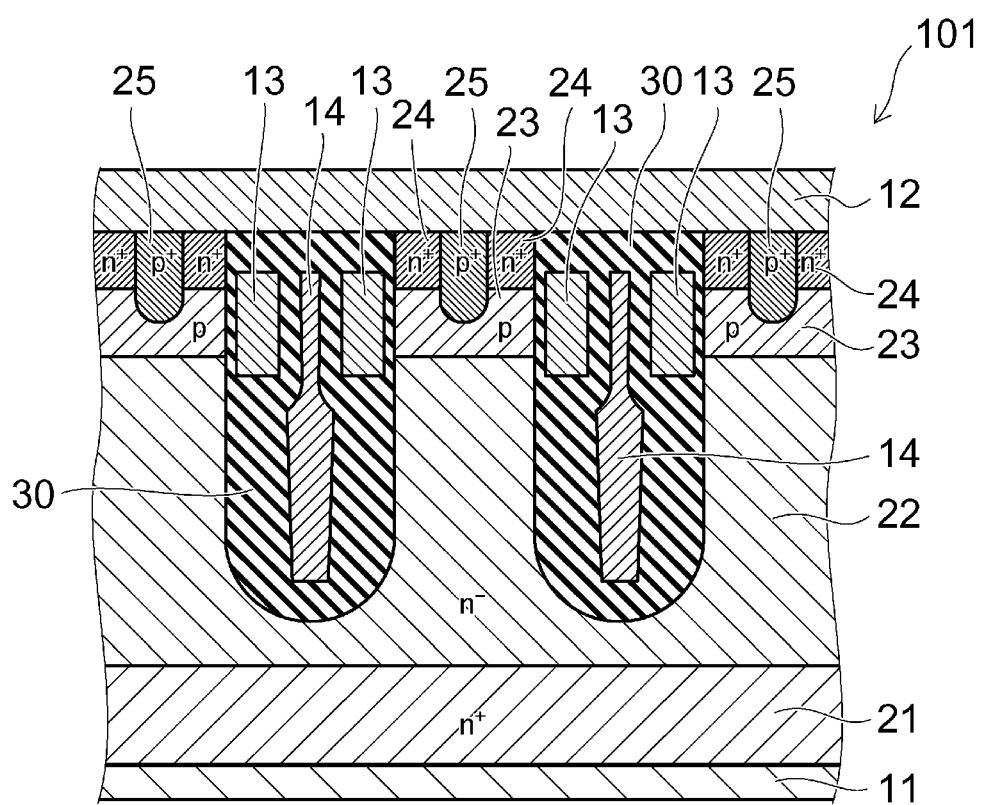
FIG. 5 is a cross-sectional view which shows a semiconductor device according to a comparative example.

FIG. 5 is a cross-sectional view which shows a semiconductor device 101 according to a comparative example.

As shown in FIG. 5, in the semiconductor device 101 according to the comparative example, an upper end of the FP electrode 14 is positioned at substantially the same height as an upper end of the gate electrode 13, and is spaced from the source electrode 12 with the insulation film 30 interposed therebetween. A portion (not shown) of the FP electrode 14 near an end of the FP electrode along the third direction (corresponding to the in-out page direction of FIG. 1) is electrically connected to the source electrode 12.

In the comparative example, since only the portion (not shown) of the FP electrode 14 is connected to the source electrode 12, a maximum distance from the source electrode 12 to the other portions of the FP electrode 14 is longer than in the semiconductor device 1 of the first embodiment. In addition, the FP electrode 14 is made of poly-silicon, and the poly-silicon generally has a resistivity higher than that of a metal. For this reason, a relatively high wiring resistance is interposed between the source electrode 12 and the portions of the FP electrode 14 away from the source electrode 12. Accordingly, for example, when switching the semiconductor device 101, a potential of the portion of the FP electrode 14 away from the source electrode 12 is likely to differ from the source potential due to being coupled with the nearby gate electrode 13 and the drain electrode 11. In particular, when switching the semiconductor device 101 at a high speed, the effective FP potential is likely to differ significantly from the source potential.

In the semiconductor device 101, since a design of each portion is optimized to maximize a breakdown voltage between the source electrode 12 and the drain electrode 11 when the FP potential is at the source potential, when the FP potential is in fact different from the source potential, the breakdown voltage is lowered. The lowering of the breakdown voltage can cause the semiconductor device 101 to shift to a dynamic avalanche mode at which the breakdown voltage is equal to or less than a threshold value, and an unintended self-turn-on can occur allowing a leakage current to flow. As a result, an operation of the semiconductor device 101 becomes unstable. In this manner, the semiconductor device 101 according to the comparative example is less reliable than the semiconductor device 1 according to the first embodiment.

Second Embodiment

Next, a second embodiment will be described.

Figure 6:
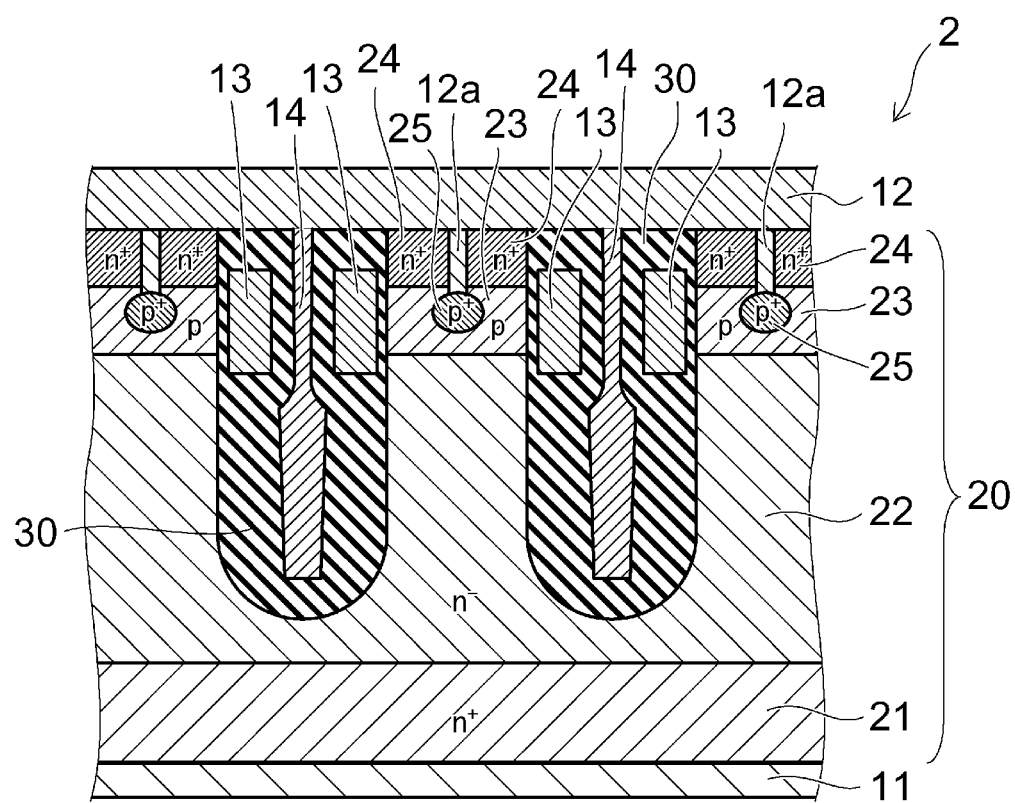
FIG. 6 is a cross-sectional view which shows a semiconductor device according to a second embodiment.

FIG. 6 is a cross-sectional view which shows a semiconductor device 2 according to a second embodiment.

As shown in FIG. 6, in the semiconductor device 2 according to the second embodiment, the $p^+$-type contact layer 25 is arranged only in the p-type base layer 23, and is not arranged in the $n^+$-type source layer 24. For this reason, the $p^+$-type contact layer 25 is not exposed at the upper surface of the semiconductor portion 20. A protruding portion 12a (first protruding portion) extending in the thickness direction is formed on a lower surface of the source electrode 12. The protruding portion 12a passes through the $n^+$-type source layer 24 in the thickness direction to connect to the p+-type contact layer 25. The protruding portion 12a is formed integrally with a body portion of the source electrode 12, and functions as an embedded electrode of the source electrode 12. The protruding portion 12a can extend along the third direction for an entirety, or substantially all, of a lower surface of the source electrode 12 or may be intermittently disposed in various parts arranged along the lower source of the source electrode along the third direction.

According to the second embodiment, since the p+-type contact layer 25 is connected to the source electrode 12 through the protruding portion 12a, a wiring resistance between a lowest portion of the p+-type contact layer 25 and the source electrode 12 is low. As a result, it is possible to reduce a resistance when discharging a hole generated during an avalanche breakdown, and it is possible to further improve the avalanche resistance.

The configuration, operation, and effects other than those described above for the second embodiment are the same as those described above for the first embodiment.

Third Embodiment

Next, a third embodiment will be described.

Figure 7:
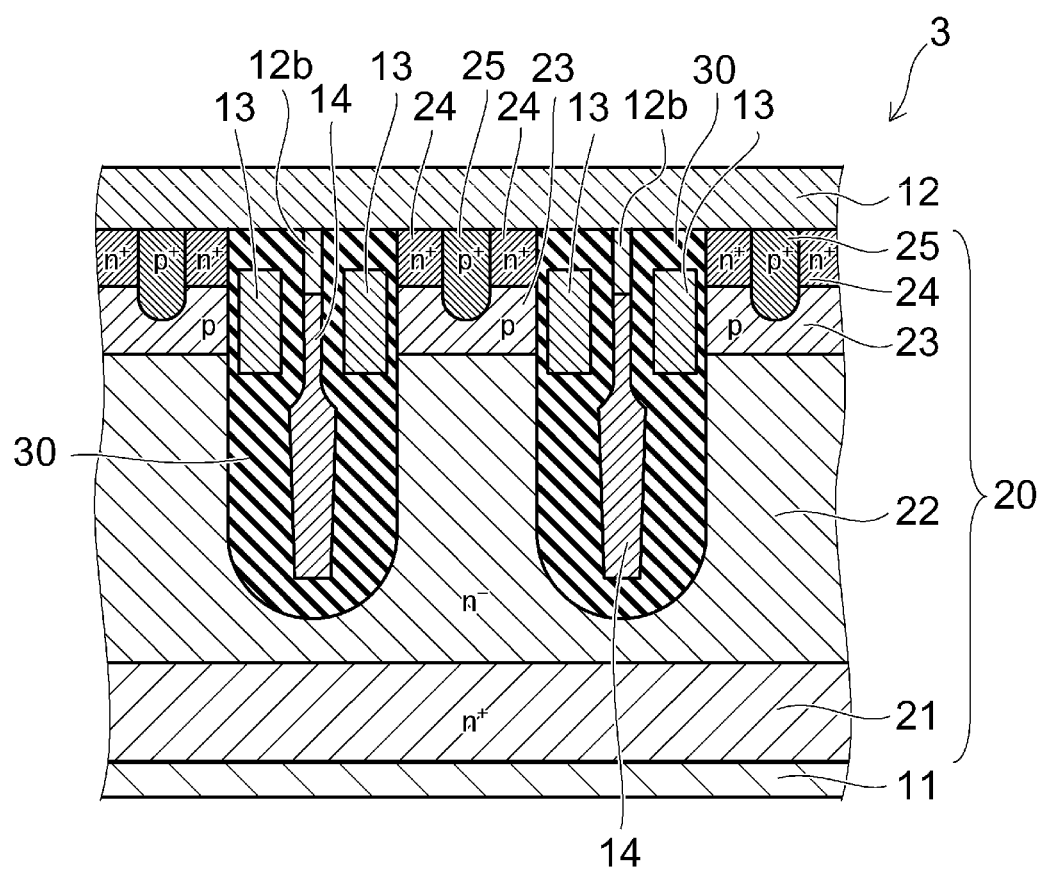
FIG. 7 is a cross-sectional view which shows a semiconductor device according to a third embodiment.

FIG. 7 is a cross-sectional view which shows a semiconductor device 3 according to the third embodiment.

As shown in FIG. 7, in the semiconductor device 3 according to the third embodiment, an upper end of the FP electrode 14 is positioned lower than an upper end of the gate electrode 13. On the other hand, a protruding portion 12b (second protruding portion) extending in the thickness direction is formed on a lower surface of the source electrode 12, and a lower end of the protruding portion 12b is in contact with an upper end of the FP electrode 14. The protruding portion 12b can extend along the lower surface of the source electrode 12 along the third direction for an entirety, or substantially all, of the lower surface of the source electrode 12 or may be intermittently disposed as various parts arranged along the lower source of the source electrode along the third direction. Accordingly, the source electrode 12 is connected to the FP electrode 14 through the protruding portion 12b. The protruding portion 12b can be formed integrally with a body portion of the source electrode 12 and functions as an embedded electrode of the source electrode 12. The protruding portion 12b can be formed of the same material as the source electrode 12, for example, a metal.

According to the third embodiment, compared with the first embodiment described above, it is possible to further shorten a distance between each portion of the FP electrode 14 and the source electrode 12 by forming the protruding portion 12b on a lower surface of the source electrode 12. Accordingly, it is possible to more stably fix a potential of the FP electrode 14 to the source potential.

The configuration, the operation, and the effects other than those described above for the third embodiment are the same as those described above for the first embodiment.

Fourth Embodiment

Next, a fourth embodiment will be described.

Figure 8:
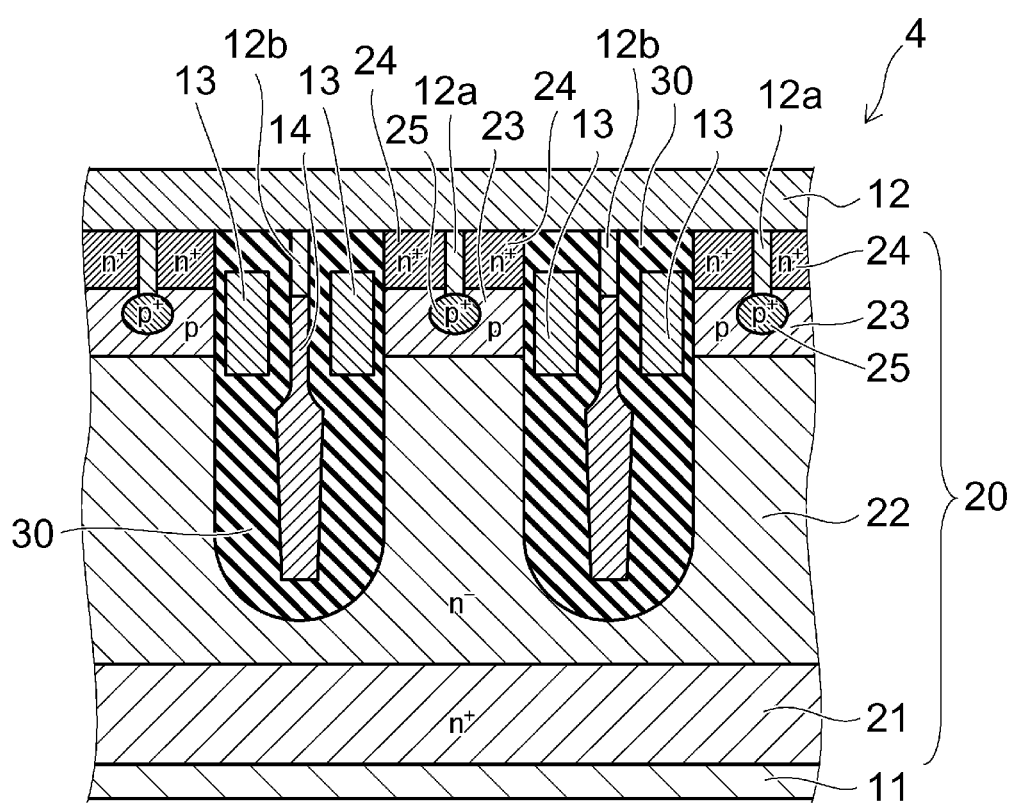
FIG. 8 is a cross-sectional view which shows a semiconductor device according to a fourth embodiment.

FIG. 8 is a cross-sectional view which shows a semiconductor device 4 according to the fourth embodiment.

As shown in FIG. 8, the fourth embodiment is an example in which the second embodiment and the third embodiment described above are combined.

That is, the protruding portion 12a and the protruding portion 12b are formed on a lower surface of the source electrode 12 in the semiconductor device 4 according to the fourth embodiment. The protruding portion 12a and the protruding portion 12b extend in the thickness direction and are alternately arranged along the first direction. A lower end of the protruding portion 12a is connected to the p+-type contact layer 25, and a lower end of the protruding portion 12b is connected to an upper end of the FP electrode 14.

In the semiconductor device 4, a hole generated during an avalanche breakdown can be quickly discharged to the source electrode 12 through the p+-type contact layer 25 and the protruding portion 12a, and a source potential can be more effectively applied to the FP electrode 14 through the protruding portion 12b. As a result, the semiconductor device 4 has high avalanche resistance and is more reliable.

The configuration, operation, and the effects other than those described above for the fourth embodiment are the same as those described above for the first embodiment.

According to the embodiments described above, it is possible to achieve a semiconductor device which can suppress a lowering of a breakdown voltage.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
a first electrode;
a first semiconductor layer of a first conductivity type on the first electrode and electrically connected to the first electrode;
a second semiconductor layer of a second conductivity type on the first semiconductor layer;
a third semiconductor layer of the first conductivity type on the second semiconductor layer;
a first insulation material disposed in a trench extending through the third semiconductor layer and the second semiconductor layer and into the first semiconductor layer;
a second electrode on the third semiconductor layer and a surface of the first insulation material and electrically connected to the third semiconductor layer;
a third electrode disposed in the first insulation material in the trench and adjacent, in a first direction, via the first insulation material to the second semiconductor layer, the third electrode being between the first electrode and the second electrode in a second direction that crosses the first direction, a portion of the first insulation material being between the third electrode and the second electrode in the second direction and electrically separating the third electrode and the second electrode; and
a fourth electrode disposed in the first insulation material in the trench and extending in the second direction through the first insulation material to have a first end electrically contacting a lower surface of the second electrode, the fourth electrode separated from the first semiconductor layer, the second semiconductor layer, the third semiconductor layer, and the third electrode by the first insulation material, an electrical resistivity of the fourth electrode being greater than an electrical resistivity of the second electrode, wherein
the third electrode comprises a pair of third electrode portions disposed in the first insulation material in the trench and spaced apart from each other in the first direction,
the fourth electrode extends along the second direction between the pair of third electrode portions,
the fourth electrode has a second end spaced from the first end in the second direction,
the first end has a first width along the first direction,
the second end has a second width along the first direction,
the first width is less than the second width, and
the fourth electrode has a width, in the first direction, that varies from the first width to the second width, and a maximum width of the fourth electrode is between the first and second ends, the maximum width being greater than the second width.

2. The semiconductor device according to claim 1, wherein
the second electrode comprises metal, and
the fourth electrode comprises silicon.

3. The semiconductor device according to claim 1, wherein
the lower surface of the second electrode is flat, and
the first end of the fourth electrode is in direct contact with the lower surface of the second electrode for a distance along a third direction that is orthogonal to the first and second directions equal to an entire length of the fourth electrode along the third direction.

4. The semiconductor device according to claim 1, further comprising:
a fourth semiconductor layer of the second conductivity type extending from the lower surface of the second electrode through the third semiconductor layer into the second semiconductor layer, a concentration of second conductivity type dopants in the fourth semiconductor layer being greater than a concentration of second conductivity type dopants in the second semiconductor layer.

5. The semiconductor device according to claim 1, further comprising:
a fourth semiconductor layer of the second conductivity type disposed in the second semiconductor layer, a concentration of second conductivity type dopants in the fourth semiconductor layer being greater than a concentration of second conductivity type dopants in the second semiconductor layer, wherein
a first protruding portion on the lower surface of the second electrode is connected to the fourth semiconductor layer.

6. The semiconductor device according to claim 5, wherein a second protruding portion on the lower surface of the second electrode extends in the second direction through the first insulation material and directly contacts the first end of the fourth electrode.

7. The semiconductor device according to claim 1, wherein a second protruding portion on the lower surface of the second electrode directly contacts the first end of fourth electrode.

8. A semiconductor device, comprising:
a first semiconductor layer of a first conductivity type on a first electrode;
a second semiconductor layer of a second conductivity type on the first semiconductor layer;
a third semiconductor layer of the first conductivity type on the second semiconductor layer;
a second electrode contacting the third semiconductor layer;
a first insulation material disposed in a trench extending through the third semiconductor layer and into the first semiconductor layer;
a pair of third electrodes disposed in the first insulation material in the trench and spaced from each other in a first direction, the first insulation material contacting the first, second, and third semiconductor layers and a lower surface of the second electrode, the lower surface being parallel to the first direction, the first insulation material separating the pair of third electrodes from the lower surface of the second electrode; and
a fourth electrode disposed in the first insulation material in the trench between the first and second electrodes in a second direction perpendicular to the first direction and between the pair of third electrodes in the first direction, the fourth electrode being separated from the pair of third electrodes by the first insulation material, wherein
a first end of the fourth electrode nearest the lower surface of the second electrode is directly contacting the lower surface of the second electrode,
the fourth electrode has a second end spaced from the first end in the second direction,
the first end has a first width along the first direction,
the second end has a second width along the first direction,
the first width is less than the second width, and
the fourth electrode has a width, in the first direction, that varies from the first width to the second width, and a maximum width of the fourth electrode is between the first and second ends, the maximum width being greater than the second width.

9. The semiconductor device according to claim 8, wherein
the second electrode comprises metal, and
the fourth electrode comprises silicon.

10. The semiconductor device according to claim 8, wherein the fourth electrode extends in a third direction that is perpendicular to the first and second directions, and the fourth electrode is in direct contact with the lower surface of the second electrode for an entire length of the fourth electrode along the third direction.

11. The semiconductor device according to claim 8, further comprising:
a fourth semiconductor layer of the second conductivity type disposed in the second semiconductor layer, a concentration of second conductivity type dopants in the fourth semiconductor layer being greater than a concentration of second conductivity type dopants in the second semiconductor layer, wherein
a first protruding portion on the lower surface of the second electrode is connected to the fourth semiconductor layer.

12. The semiconductor device according to claim 11, wherein a second protruding portion on the lower surface of the second electrode extends in the second direction through the first insulation material and directly contacts the first end of the fourth electrode.

13. The semiconductor device according to claim 8, wherein a second protruding portion on the lower surface of the second electrode directly contacts the first end of fourth electrode.

14. A semiconductor device, comprising:
a drain layer of a first conductivity type;
a drift layer of the first conductivity type provided on the drain layer;
a base layer of a second conductivity type provided on the drift layer;
a source layer of the first conductivity type provided on the base layer;
a first insulation material disposed in a trench extending through the source layer and the base layer and into the drift layer;
a pair of gate electrodes disposed in the first insulation material in the trench and spaced apart in a first direction;
a drain electrode electrically connected to the drain layer;
a source electrode electrically connected to the source layer, the source electrode having a surface parallel to the first direction, the surface having a portion in contact with the source layer; and
a field plate electrode disposed in the first insulation material in the trench between the pair of gate electrodes in the first direction and extending in a second direction crossing the first direction, the field plate electrode having a first end directly connected to the surface of the source electrode, wherein
a portion of the first insulation material is between the pair of gate electrodes and the surface of the source electrode and electrically separating the pair of gate electrodes from the source electrode,
the field plate electrode has a second end spaced from the first end in the second direction,
the first end has a first width along the first direction,
the second end has a second width along the first direction,
the first width is less than the second width, and
the field plate electrode has a width, in the first direction, that varies from the first width to the second width, and a maximum width of the field plate electrode is between the first and second ends, the maximum width being greater than the second width.

15. The semiconductor device according to claim 14, wherein the first end of the field plate electrode is directly connected to the source electrode for an entire width of the first end of the field plate electrode in the first direction.

* * * * *